United States Patent
Mandelli et al.

(10) Patent No.: US 12,241,921 B2
(45) Date of Patent: Mar. 4, 2025

(54) APPARATUS COMPRISING AT LEAST ONE PROCESSOR

(71) Applicant: NOKIA SOLUTIONS AND NETWORKS OY, Espoo (FI)

(72) Inventors: Silvio Mandelli, Ludwigsburg (DE); Jinfeng Du, West Windsor, NJ (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 127 days.

(21) Appl. No.: 18/103,769

(22) Filed: Jan. 31, 2023

(65) Prior Publication Data
US 2023/0251294 A1 Aug. 10, 2023

(30) Foreign Application Priority Data
Feb. 4, 2022 (FI) .................................. 20225100

(51) Int. Cl.
*G01R 33/36* (2006.01)
*G01R 29/08* (2006.01)

(52) U.S. Cl.
CPC ................ *G01R 29/0892* (2013.01)

(58) Field of Classification Search
CPC ................................................ G01R 29/0892
See application file for complete search history.

(56) References Cited

U.S. PATENT DOCUMENTS

| 11,133,851 B1 * | 9/2021 | Hokayem ............... H01P 5/16 |
| 2016/0248484 A1 | 8/2016 | Sayeed et al. |
| 2018/0048364 A1 | 2/2018 | Girnyk et al. |

FOREIGN PATENT DOCUMENTS

KR 20180087563 A 8/2018

OTHER PUBLICATIONS

Hammes et al., Generalized Multiplexed Waveform Design Framework for Cost-Optimized MIMO Radar, IEEE pp. 88-102, 2020 (Year: 2020).*
Chi Shiang Wang et al. Reduced Complexity Channel Estimation by Hierarchical Interpolation Exploiting Sparsity for Massive MIMO Systems with Uniform Rectangular Array, ICASSP2021 2021 IEEE International Conference on Acoustics, Speech and Signal Processing (ICASSP), IEEE, Jun. 6,2021 ,pp. 7938-7942 (Year: 2021).*
Davis et al. (Coherent MIMO radar the phased array and orthogonal waveforms) IEEE vol. 29, No. 8 2014 (Year: 2014).*
Extended European Search Report dated Jun. 5, 2023 corresponding to European Patent Application No. 23152459.6.
(Continued)

*Primary Examiner* — Alesa Allgood
(74) *Attorney, Agent, or Firm* — SQUIRE PATTON BOGGS (US) LLP

(57) ABSTRACT

An apparatus, comprising at least one processor, and at least one memory storing instructions, the at least one memory and the instructions configured to, with the at least one processor, cause the apparatus to sample an angular response of a uniform antenna array uniformly in a normalized angular frequency range to obtain a set of angular samples, and to reconstruct an angular response of the uniform antenna array based on the set of angular samples and at least one Dirichlet kernel.

14 Claims, 8 Drawing Sheets

(56) References Cited

OTHER PUBLICATIONS

Chi-Shiang Wang et al., "Reduced-Complexity Channel Estimation by Hierarchical Interpolation Exploiting Sparsity for Massive MIMO Systems with Uniform Rectangular Array," ICASSP 2021—2021 IEEE International Conference on Acoustics, Speech and Signal Processing (ICASSP), IEEE, Jun. 6, 2021, pp. 7938-7942, XP033955361.

Christian Hammes et al., "Generalized Multiplexed Waveform Design Framework for Cost-Optimized MIMO Radar," IEEE Transactions on Signal Processing, vol. 69, Nov. 27, 2020, pp. 88-102, XP011827286.

Michael S. Davis et al., "Coherent: MIMO Radar: The Phased Array and Othogonal Waveforms," IEEE Aerospace and Electronic Systems Magazine, IEEE, vol. 29, No. 8, Aug. 1, 2014, pp. 76-91, XP011575592.

Office Action dated Aug. 31, 2022 corresponding to Finnish Patent Application No. 20225100.

Finnish Search Report dated Aug. 31, 2022 corresponding to Finnish Patent Application No. 20225100.

Wei Lin et al., "Theoretical Analysis of Beam-Steerable, Broadside-Radiating Huygens Dipole Antenna Arrays and Experimental Verification of an Ultrathin Prototype for Wirelessly Powered IoT Applications," IEEE Open Journal of Antennas and Propagation, IEEE, Sep. 21, 2021, vol. 2, pp. 954-967.

Surendra Prasad, "Linear Antenna Arrays with Broad Nulls with Applications to Adaptive Arrays," IEEE Transactions on Antennas and Propagation, IEEE, vol. 27, No. 2, Mar. 1979, pp. 185-190.

* cited by examiner

Fig. 4

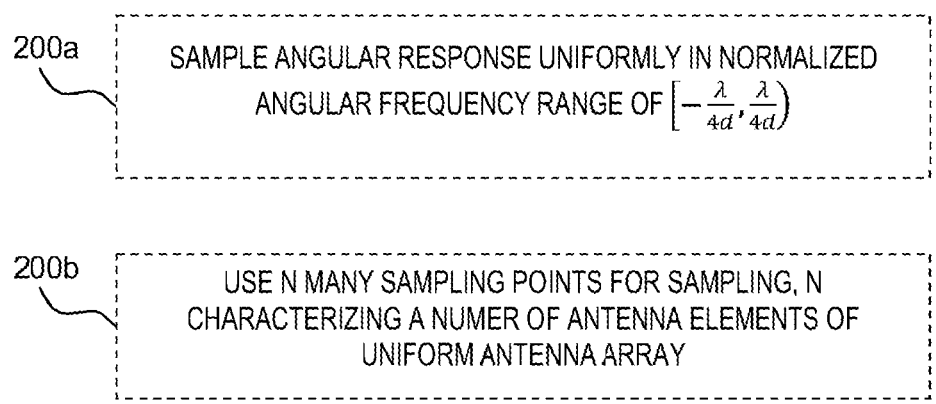

200a — SAMPLE ANGULAR RESPONSE UNIFORMLY IN NORMALIZED ANGULAR FREQUENCY RANGE OF $\left[-\frac{\lambda}{4d}, \frac{\lambda}{4d}\right)$ 200b — USE N MANY SAMPLING POINTS FOR SAMPLING, N CHARACTERIZING A NUMER OF ANTENNA ELEMENTS OF UNIFORM ANTENNA ARRAY

Fig. 5

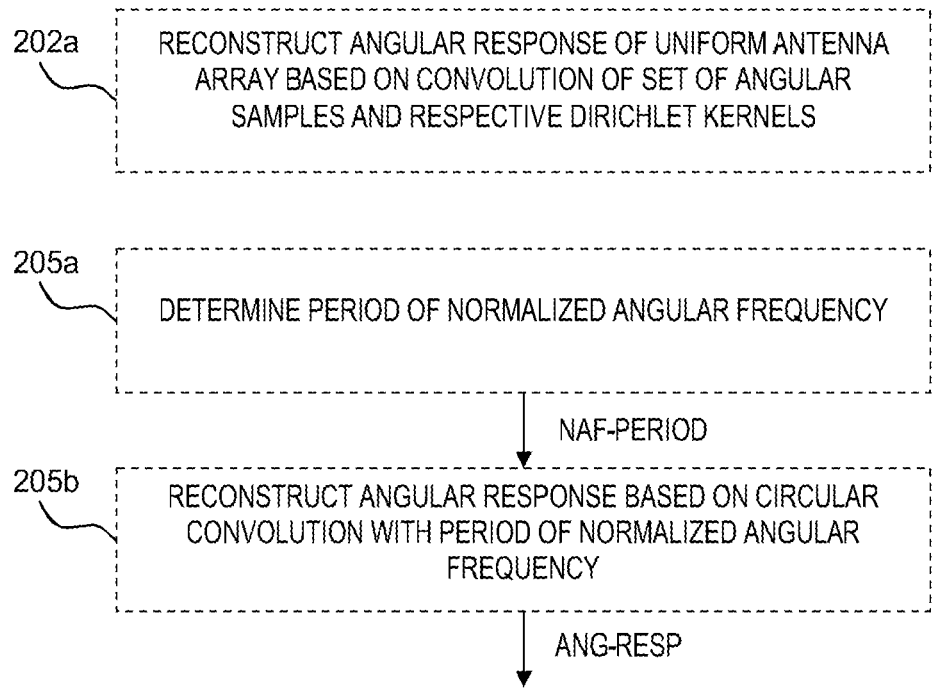

202a — RECONSTRUCT ANGULAR RESPONSE OF UNIFORM ANTENNA ARRAY BASED ON CONVOLUTION OF SET OF ANGULAR SAMPLES AND RESPECTIVE DIRICHLET KERNELS

205a — DETERMINE PERIOD OF NORMALIZED ANGULAR FREQUENCY

↓ NAF-PERIOD

205b — RECONSTRUCT ANGULAR RESPONSE BASED ON CIRCULAR CONVOLUTION WITH PERIOD OF NORMALIZED ANGULAR FREQUENCY

↓ ANG-RESP

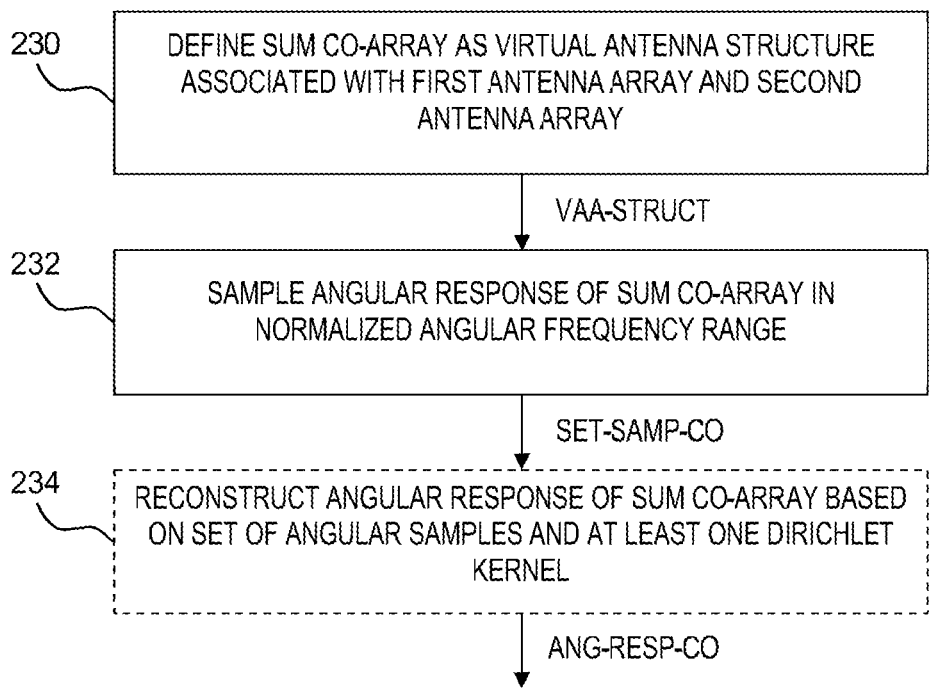
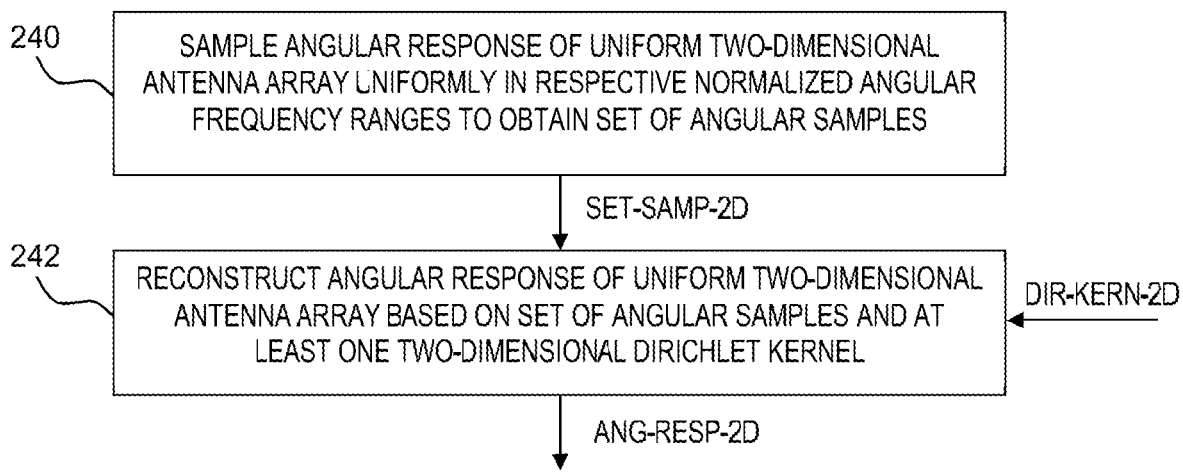

APPARATUS COMPRISING AT LEAST ONE PROCESSOR

CROSS REFERENCE TO RELATED APPLICATION

This application claims the benefit of Finnish Patent Application No. 20225100, filed Feb. 4, 2022. The entire content of the above-referenced application is hereby incorporated by reference.

FIELD OF THE DISCLOSURE

Various example embodiments relate to an apparatus comprising at least one processor.

Further embodiments relate to a method of operating related to such apparatus.

BACKGROUND

Wireless communications systems may e.g. be used for wireless exchange of information between two or more entities, e.g. comprising one or more terminal devices, e.g. user equipment, and one or more network devices such as e.g. base stations.

The 5th generation of mobile communication drives current communication networks towards physical limits, for example regarding latency, throughput, and spectral efficiency. The next (sixth) generation (6G) extends networks further, for example by converting communication networks to a joint physical-biological network, wherein, for example, a controller can sense a state and behavior of active and/or passive nodes/devices/objects within its environment.

Given the high bandwidth required to achieve good range resolution, mmWave or sub-THz frequencies are also considered to be a candidate for such applications. In these frequency bands, the usage of grid of beams (GoB), analog beamforming and/or hybrid beamforming is preferred to reduce the cost of having a digital chain per antenna element. This requires observing only one or few beams/directions at a time, thus sampling the angular domain.

SUMMARY

Various embodiments of the disclosure are set out by the independent claims. The exemplary embodiments and features, if any, described in this specification, that do not fall under the scope of the independent claims, are to be interpreted as examples useful for understanding various exemplary embodiments of the disclosure.

Some embodiments relate to an apparatus according to claim 1.

In some embodiments, this enables to efficiently determine a reconstructed angular response, even for antenna arrays with a large number of antenna elements, without sampling the angular response at every possible incoming angle $\theta$ for a given scenario. In some embodiments, it may be particularly beneficial to apply the principle according to the embodiments to antenna array(s) with analog and/or hybrid structures, where for example some antenna elements, for example all antenna elements, are not driven by a (respective "own") digital radio front end.

The normalized angular frequency range is characterized by $$\phi = \frac{\sin(\theta)}{2},$$

wherein $\phi$ a normalized angular frequency, wherein $\theta$ characterizes an angle between a boresight direction and a target direction, e.g. "incoming angle" or incident angle, when exemplarily considering an incoming electromagnetic wave, for example an azimuth angle in case of a horizontally oriented ULA.

In some embodiments, the uniform antenna array is a one-dimensional antenna array, for example a uniform linear array (ULA) antenna with a plurality of e.g. N many equally spaced antenna elements.

In some embodiments, a normalized angular frequency response may be characterized by the receive matched beamforming:

$$L_N(\ell) = 1/N \sum_{n=0}^{N-1} a_n e^{-j2\pi \frac{2}{\lambda} x_n \ell},$$

here $a_n$ is the signal of an n-th antenna element, wherein $x_n$ is a location of the n-th antenna element.

In some embodiments, the normalized angular frequency response may be sampled, e.g. at $$\ell = \frac{n\lambda}{2dN},$$

with $$n \in \left\{ n \in \mathbb{Z}: -\frac{N}{2} \le n < \frac{N}{2} \right\},$$

wherein d is a distance or spacing between adjacent antenna elements, and wherein $\lambda$ is a wavelength.

In some embodiments, the uniform antenna array is a two-dimensional antenna array, for example a uniform rectangular array (URA) antenna having a matrix-type arrangement with N many rows and M many columns of antenna elements. In some embodiments, the antenna elements may be equally spaced along at least one of the two dimensions. In some embodiments, an inter-element spacing of the antenna elements in a first dimension may be equal to an inter-element spacing of the antenna elements in a second dimension. In some other embodiments, the inter-element spacing of the antenna elements in the first dimension may be different from the inter-element spacing of the antenna elements in the second dimension.

In some embodiments, the angular response of an antenna array, as e.g. determined by the method according to exemplary embodiments, e.g. the reconstructed angular response, may be used to determine an Angle of Departure (AoD) and/or Angle of Arrival (AoA), for example of a strongest path, for example for communication applications, which, according to some embodiments, may for example enable a base station or generally a transmission and/or reception access point, to serve a user with the best radio beam possible.

In some embodiments, the angular response of an antenna array, as e.g. determined by the method according to exemplary embodiments, e.g. the reconstructed angular response, may be used in sensing applications, for example to reconstruct an image such as a radar image of an environment, e.g. by evaluating directional information as e.g. characterized by the Angle of Departure and/or by the Angle of Arrival (AoA). In some embodiments, beamforming weights to achieve angular scans can e.g. be designed according to some desired Point Spread Function (PSF), that determines an impact e.g. of an impulsive scatterer at a certain angle with respect to the full image. In some embodiments, basically, this impact can be related to the resolution (e.g. characterized by a main lobe width) and the side lobes' relative amplitude.

Some exemplary embodiments, which will be discussed in detail further below, provide information regarding a) how many angles and b) which angles should be scanned, e.g. for the uniform sampling of the angular response in the normalized angular frequency range, e.g. for being able to recover, for example without loss, the angular response of the antenna array. Further exemplary embodiments, which will also be discussed in detail further below provide information regarding c) how to reconstruct the angular response at every angle associated with the considered normalized angular frequency range.

While the further explanations primarily refer to one-dimensional antenna arrays such as e.g. ULA antennas, for sake of simplicity, note that in further exemplary embodiments the principle of the embodiments disclosed herein may also be applied to other antenna array types such as e.g. two-dimensional antenna arrays, for example URA antennas.

In some embodiments, with an ULA antenna, one operates on a one-dimensional (1D) angular dimension corresponding to an incident angle to an orthogonal plane to the 1D array.

In some embodiments, with an URA antenna, one operates with a two-dimensional (2D) incident angle to the orthogonal axes of the 2D array.

In some exemplary embodiments, the instructions, when executed by the at least one processor, cause the apparatus to sample the angular response of the uniform antenna array uniformly in a normalized angular frequency range characterized by an interval $$\left[-\frac{\lambda}{4d}, \frac{\lambda}{4d}\right),$$

wherein $\lambda$ characterizes a wavelength, wherein d characterizes a distance between adjacent antenna elements.

In some exemplary embodiments, the instructions, when executed by the at least one processor, cause the apparatus to use N many sampling points for the sampling of the angular response of the uniform antenna array, wherein N characterizes a number of antenna elements of the uniform antenna array.

In some embodiments, a maximum sampling step size for the sampling of the angular response of the uniform antenna array in the normalized angular frequency range is given by $$\frac{\lambda}{2dN},$$

whereby a loss of information can be avoided. In some embodiments, avoiding the mentioned loss if information means that the angular response can be perfectly reconstructed, e.g. like if infinite samples were available to probe every possible angle.

In some embodiments, for example, if more scans are available, more samples can be taken for the sampling of the angular response, e.g. by sampling with a smaller sampling period, which, in some embodiments may enable to reduce beam misalignment penalties, e.g. with mmWave channel estimation applications.

In some embodiments, if less scans are available, e.g. due to limited resources or a codebook, for example GoB codebook, the resolution can be reduced and the full angular domain can e.g. be scanned by using less antenna elements, thus increasing the sampling period.

In other words, in some embodiments, it is proposed to determine whether less scans than required for a perfect (e.g., lossless) reconstruction of the angular response are available, and, if less scans than required for the perfect (e.g., lossless) reconstruction of the angular response are available, e.g. if a number of available scans is smaller than a number N of antenna elements, to reduce a resolution, e.g. by scanning the full angular domain using less than said N many antenna elements.

In some embodiments, it is possible to focus the available, for example few, scans onto a limited (normalized) angular region of interest, for example by avoiding scans elsewhere, e.g. outside the (normalized) angular region of interest.

In some embodiments, the extremes of the sampled normalized angular frequency range should be $$+/-\frac{\lambda}{4d},$$

but in some other embodiments, $$\text{also } +/-0.5 \min\left(1, \frac{\lambda}{2d}\right),$$

can be considered, where d is the distance between adjacent antenna elements and $\lambda$ is the wavelength.

In some embodiments, the antennas may be spaced more than $$\frac{\lambda}{2}$$

apart from each other, wherein aliasing may occur in the angular domain, so that, in further embodiments, a search space may be restricted, e.g. to an angular interval of interest with a total normalized angular frequency of $$\frac{\lambda}{2d} < 1,$$

thus for example not spanning the whole −90, +90 degree interval.

In some embodiments, the instructions, when executed by the at least one processor, cause the apparatus to reconstruct the angular response of the uniform antenna array based on a circular convolution of the set of angular samples and respective Dirichlet kernels. In some embodiments, this may enable a particularly efficient reconstruction of the angular response.

In some embodiments, the set of angular samples is characterized by $$L_N\left(n\frac{\lambda}{2dN}\right),$$

wherein n is an integer, with $$-\frac{N}{2} \leq n < \frac{N}{2},$$

wherein N characterizes a number of antenna elements of the uniform antenna array, wherein $\lambda$ characterizes a wavelength, wherein d characterizes a distance between adjacent antenna elements, wherein the respective Dirichlet kernels are characterized by $$D_N\left(\frac{2d}{\lambda}\left(l - n\frac{\lambda}{2dN}\right)\right),$$

and wherein the convolution, e.g. circular convolution of period $$\frac{\lambda}{2d},$$

of the set of angular samples and respective Dirichlet kernels is characterized by $$R_N(l) = \sum_{n \in \mathcal{N}_N} L_N\left(n\frac{\lambda}{2dN}\right) D_N\left(\frac{2d}{\lambda}\left(l - n\frac{\lambda}{2dN}\right)\right),$$

wherein l characterizes a normalized angular frequency, wherein $R_N(l)$ characterizes a reconstructed angular response, wherein $$\mathcal{N}_N = \left\{n \in \mathbb{Z}: -\frac{N}{2} \leq n < \frac{N}{2}\right\}.$$

In some embodiments, if the distance d between adjacent antenna elements corresponds to one half of the wavelength $\lambda$, the reconstructed angular response is characterized by $$R_N(l) = \sum_{n \in \mathcal{N}_N} L_N\left(\frac{n}{N}\right) D_N\left(l - \frac{n}{N}\right).$$

In some embodiments, the Dirichlet kernel is characterized by $$D_N(\ell) = \frac{\sin \pi N \ell}{N \sin \pi \ell}.$$

In some embodiments, it is proposed to uniformly sample a normalized angular frequency range characterized by the interval $$\left[-\frac{\lambda}{4d}, \frac{\lambda}{4d}\right)$$

with N many points with the antenna array, for example using a matched beamformer, whereby in some embodiments a sampled normalized angular frequency response as characterized by the following equation is obtained $$L_N(\ell) = 1/N \sum_{n=0}^{N-1} a_n e^{-j2\pi \frac{2}{\lambda} x_n \ell},$$

sampled at $$\ell = \frac{n\lambda}{2dN},$$

where $a_n$ is the signal of the n-th antenna element, wherein $x_n$ is the location of the n-th antenna element, and $$n \in \left\{n \in \mathbb{Z}: -\frac{N}{2} \leq n < \frac{N}{2}\right\}.$$

For instance, in some embodiments, e.g. in the particular case of the center of the array being at 0, one may consider $$x_n = \left(-\frac{N-1}{2} + n\right)d.$$

In some embodiments, adopting the approach of the exemplary embodiments explained above, a minimum number of samples for a lossless reconstruction for given array aperture dN (i.e., including a general array spacing with $$d = \frac{\lambda}{2}$$

as a special case) may be determined.

In some embodiments, adopting the approach of the exemplary embodiments explained above enables a reconstruction of the angular response for a reduced angular domain, for example in cases where fewer samples are available.

Moreover, in further exemplary embodiments, the approach of the exemplary embodiments explained above may be extended e.g. for sensing applications.

In some embodiments, a sampled normalized angular frequency response function can be characterized using Dirac's delta function $\delta(\cdot)$ where a sample is available and a value of zero elsewhere, for example as defined by the equation:

$$L'_N(\ell) = \sum_{n \in \mathcal{N}_N} L_N\left(\frac{l\lambda}{2dN}\right) \delta\left(\ell - \frac{n\lambda}{2dN}\right).$$

In other words, in some embodiments, the set of angular samples as obtained according to exemplary may be characterized by the aforementioned sampled normalized angular frequency response function $L'_N(\ell)$.

In some embodiments, the instructions, when executed by the at least one processor, cause the apparatus to determine a period $P_N$ of the normalized angular frequency based on a number N of antenna elements of the uniform antenna array, a distance d between adjacent antenna elements of the uniform antenna array, and a wavelength $\lambda$, and to reconstruct the angular response of the uniform antenna array based on a circular convolution with the period $P_N$ of the normalized angular frequency of the set $L'_N(\ell)$ of angular samples and respective Dirichlet kernels $$D'_N\left(\frac{2d}{\lambda}\ell\right),$$

wherein $$D'_N\left(\frac{2d}{\lambda}\ell\right) = \begin{cases} D_N\left(\frac{2d}{\lambda}\ell\right) & \text{if } |\ell| \le P_N/2 \\ 0 & \text{otherwise} \end{cases},$$

wherein in some embodiments $$D'_N\left(\frac{2d}{\lambda}\ell\right)$$

may be interpreted as a windowed Dirichlet kernel, with non-zero elements only in the interval $$\left[-\frac{P_N}{2}, \frac{P_N}{2}\right].$$

In some embodiments, the period of the normalized angular frequency is characterized by $$P_N = \frac{\lambda}{2d}(1 + \mathrm{mod}_2(N-1)).$$

Note that the Period $P_N$ doubles with even values of N.

In some embodiments, the instructions, when executed by the at least one processor, cause the apparatus to determine an up-sampled reconstructed angular response $R_u$ based on the equation $R_u = F^{-1}(F(l_u) \odot F(d_u))$, wherein $F(\bullet)$ characterizes a discrete Fourier transform, DFT, wherein $F^{-1}(\bullet)$ characterizes an inverse discrete Fourier transform, wherein the vectors $l_u$, $d_u$ are explained in the following, wherein $\odot$ characterizes a Hadamard product. In some embodiments, this enables a computationally particularly efficient determination of the reconstructed angular response.

In some embodiments, available samples $L'_N(nB_N^{-1})$, $n \in \mathcal{N}_N$ may be up-sampled by the up-sampling factor U, e.g. getting all $L'_N(uB_{NU}^{-1})$, with $u \in \mathcal{N}_{NU}$.

In some embodiments, vectors of V elements may be created based on the equation $V = P_N B_{NU} = NU(1 + \mathrm{mod}_2(N-1))$, e.g. spanning a period of continuous functions as defined by the equations $\ell = u\lambda/(2dNU) = u(UB_N)^{-1} =$ _u $(B_{NU})^{-1}$, wherein $B_N = 2dN/\lambda$, $B_{NU} = 2dNU/\lambda$. Note that a set of indexes for u according to some embodiments is given further below.

In some embodiments, the vectors are circularly shifted such that their first element corresponds to a zero normalized angular frequency as follows:

$$l_u = \begin{cases} L_N\left(\frac{\mathrm{mod}_u(u+V/2)-V/2}{B_{NU}}\right) & \text{if } u = Un, n \in \mathcal{N}_N \\ 0 & \text{otherwise} \end{cases}, \text{ and}$$

$$d_u = D_N\left(\frac{u}{NU}\right),$$

where $u \in \{u \in \mathbb{N}_0: u < V\}$, which characterizes $u = \{0, 1, \ldots, V-1\}$, giving vectors of V elements.

In some embodiments, the instructions, when executed by the at least one processor, cause the apparatus to determine if the number N of antenna elements of the uniform antenna array is even, and, if the number N is even, to double a sequence length associated with the set of angular samples to obtain an extended set of angular samples.

In some embodiments, the instructions, when executed by the at least one processor, cause the apparatus to define a sum co-array as a virtual antenna array structure associated with a first antenna array and a second antenna array, and to sample an angular response of the sum co-array uniformly in the normalized angular frequency range to obtain a set of angular samples. In some embodiments, the first antenna array may at least temporarily operate as a transmitter, and the second antenna array may at least temporarily operate as a receiver.

In some embodiments, for example when performing sensing operations, it may be beneficial to synchronize both a directional transmitter comprising for example a first antenna array, for example a first ULA antenna, and a (directional) receiver comprising for example a second antenna array, for example a second ULA antenna, e.g. orchestrating an operation of the two ULA antennas. Note that in some embodiments, this does not imply or require a, for example tight, synchronization.

In some embodiments, for example with sensing or radar applications in general, there could be antenna arrays with comparatively big apertures both at a transmitter and at a receiver. In some embodiments, in particular, if such antenna arrays are co-located or provided with full duplex capabilities, they may be considered to have the same aperture.

In some embodiments, it is proposed to use the sum co-array technique for dimensioning angular scans and/or for reconstruction, for example with analog or hybrid structures, where each antenna element is not driven by a digital radio front end. As an example, therefore, in some embodiments, in case of a ULA antenna having N many antenna elements as both a transmitter and a receiver (e.g., with a same antenna distance and with a same orientation), the sum co-array may be characterized by a ULA antenna having (2N−1) many antenna elements, wherein, in some embodiments, (2N−1) many angular samples may be determined by sampling the angular response of the sum co-array uniformly in the normalized angular frequency domain, and wherein, in some embodiments, a reconstruction may be made using Dirichlet kernels of the same order.

In some embodiments, the principle according to the embodiments may also be applied to other antenna arrays than one-dimensional antenna arrays, e.g. to two-dimensional antenna arrays. In some embodiments, it is proposed to determine two-dimensional angular estimates or samples, e.g. allowing to discriminate both azimuth and elevation.

In some embodiments, a N×M URA antenna can be seen as a sum co-array of a N elements horizontal ULA antenna and a M elements vertical ULA antenna, whose array lines are orthogonal and define a plane of the URA antenna.

In some embodiments, the instructions, when executed by the at least one processor, cause the apparatus to sample an angular response of a uniform two-dimensional antenna array uniformly in respective normalized angular frequency ranges (e.g. being associated with azimuth and elevation, respectively) to obtain a set of angular samples, and to reconstruct an angular response of the uniform two-dimensional antenna array based on the set of angular samples and at least one two-dimensional Dirichlet kernel.

In some embodiments, it is proposed to determine a, for example full, two-dimensional angular response by performing N·M many scans, i.e. determining N many samples along a first dimension in a respective first normalized angular frequency range and determining M many samples along a second dimension in a respective second normalized angular frequency range, wherein the scanning or sampling directions e.g. correspond with azimuth and elevation angles in a cardinal product of two angular sets of each respective ULA antenna.

In some embodiments, the two-dimensional angular response may be characterized by $$\mathcal{L}_{N,M}^{(Rx)} = \mathcal{L}_N^{(Rx)} \times \mathcal{L}_M^{(Rx)} =$$
$$= \{(nB_N^{-1}, mB_M^{-1}): n \in \mathcal{N}_N, m \in \mathcal{N}_M\}.$$

In some embodiments, the two-dimensional Dirichlet kernels may be characterized by $$D_{N,M}(\ell, \eta)\left(\frac{2d_1}{\lambda}, \frac{2d_2}{\lambda}\right) = D_N\left(\frac{2d_1}{\lambda}\ell\right) \cdot D_M\left(\frac{2d_2}{\lambda}\eta\right),$$

wherein $d_1$ characterizes a spacing of antenna elements along the first dimension, wherein $d_2$ characterizes a spacing of antenna elements along the second dimension, wherein $\ell$ characterizes a first dimension associated with the normalized angular frequency, and wherein $\eta$ characterizes a second dimension associated with the normalized angular frequency, e.g., in some embodiments, a normalized azimuth frequency and a normalized elevation frequency, as e.g. obtained with the normalized angular frequency transformation explained above.

In some embodiments, e.g., if there is a reduced number of scans (or samples, respectively) available, or if there is no interest for a particularly high resolution in one angular direction, in some embodiments, the scan size can be reduced.

In some embodiments, the instructions, when executed by the at least one processor, cause the apparatus to perform a sequential beam scan and/or to scan at least some points in the normalized angular frequency range more than once.

In some embodiments, for example during angular sweeps, a response of an environment may change due to, for example, objects moving. In such settings, a phase may quickly rotate, especially at comparatively high carrier frequencies, which may, in some embodiments, generate interference, e.g. when reconstructing an angular response.

In view of this, in some embodiments, e.g. for a highly dynamic scenario (for example, with a coherence time in the order of or shorter than a full angular sweep duration), it is proposed to perform a sequential beam scan in the normalized angular frequency range, e.g. to keep consecutively scanned angles also close in time, e.g., scanning angles in an ascending/descending order in the normalized angular frequency range.

In some embodiments, some angles can be scanned multiple times (for example, when sweeping the normalized angular frequency range interval, in some embodiments it is proposed at the end of the sweep to at least partly scan again a beginning of the interval, e.g. to preserve a phase coherence, for example for targets at an end of the normalized angular frequency range interval). For instance, with N=8 and d=λ/2, in some embodiments, it is proposed to scan the normalized angular frequency at the values −0.5, −0.375, −0.25, −0.125, 0, 0.125, 0.25, 0.375, −0.5, −0.375 (e.g., two additional scans at the extremes −0.5, −0.375).

Some embodiments relate to an apparatus according to claim 13.

Some embodiments relate to a method according to claim 14.

Further embodiments relate to a computer program or computer program product comprising instructions which, when the program is executed by a computer, cause the computer to carry out the method according to the embodiments.

Some embodiments relate to a device for wireless applications such as communications and/or sensing, comprising at least one apparatus according to the embodiments. In some embodiments, the device may be a base station for a cellular communications network. In some embodiments, the device may be a mobile device, e.g. a mobile terminal.

DESCRIPTION OF SOME EXEMPLARY EMBODIMENTS

Figure 1:
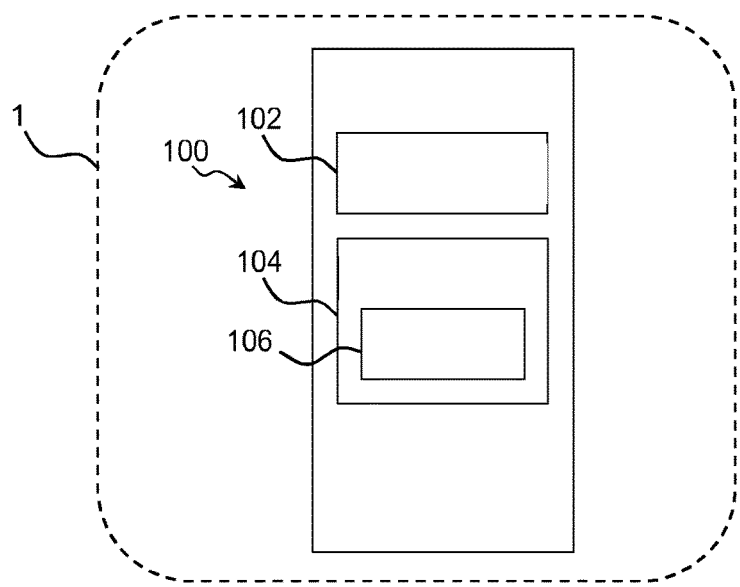
FIG. 1 schematically depicts a simplified block diagram according to some embodiments, FIG. 2A schematically depicts a simplified linear antenna array according to some embodiments, FIG. 2B schematically depicts a simplified linear antenna array according to some embodiments, FIG. 2C schematically depicts a simplified rectangular antenna array according to some embodiments, FIG. 3 schematically depicts a simplified flow chart according to some embodiments, FIG. 4 schematically depicts a simplified flow chart according to some embodiments, FIG. 5 schematically depicts a simplified flow chart according to some embodiments, FIG. 6 schematically depicts a simplified flow chart according to some embodiments, FIG. 7 schematically depicts a simplified flow chart according to some embodiments, FIG. 8 schematically depicts a simplified flow chart according to some embodiments, FIG. 9 schematically depicts a simplified flow chart according to some embodiments, FIG. 10 schematically depicts a simplified block diagram according to some embodiments, FIG. 11 schematically depicts a simplified block diagram according to some embodiments, FIG. 12 schematically depicts a simplified diagram according to some embodiments, FIG. 13 schematically depicts a simplified diagram according to some embodiments, FIG. 14 schematically depicts a simplified diagram according to some embodiments, FIG. 15 schematically depicts a simplified diagram according to some embodiments.
Figure 3:
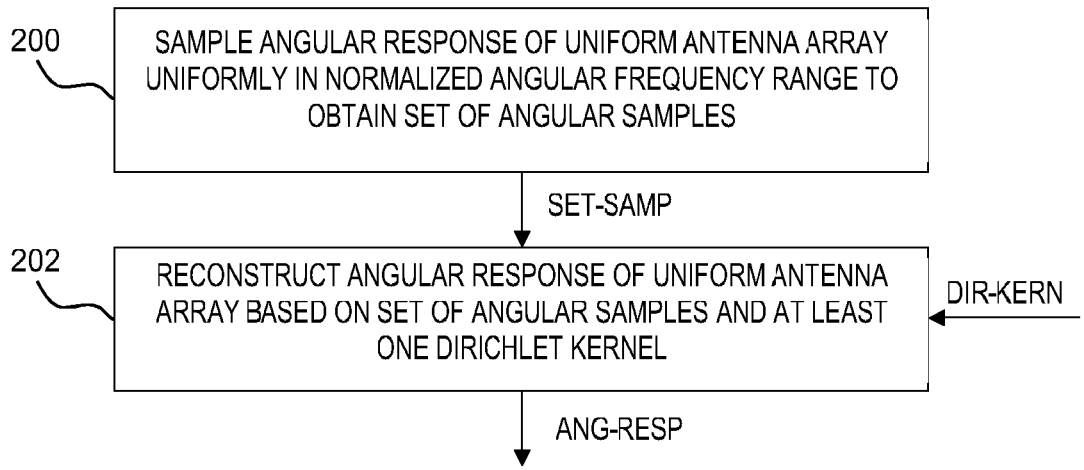

Some embodiments, see FIGS. 1 and 3, relate to an apparatus 100, comprising at least one processor 102, and at least one memory 104 storing instructions 106, the at least one memory 104 and the instructions 106 configured to, with the at least one processor 102, cause the apparatus 100 to sample 200 (FIG. 3) an angular response of a uniform antenna array uniformly in a normalized angular frequency range to obtain a set of angular samples SET-SAMP, and to reconstruct 202 an angular response ANG-RESP of the uniform antenna array based on the set SET-SAMP of angular samples and at least one Dirichlet kernel DIR-KERN.

In some embodiments, this enables to efficiently determine a reconstructed angular response, even for antenna arrays with a large number of antenna elements, without sampling the angular response at every possible incoming angle θ for a given scenario.

Figure 2A:
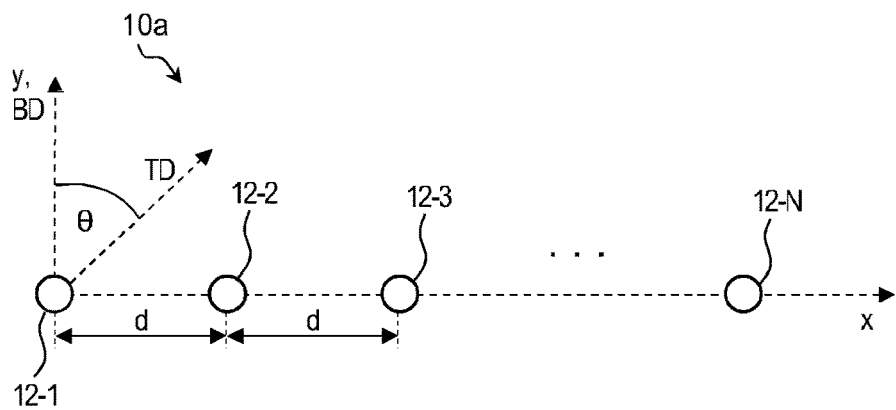

In some embodiments, FIG. 2A, the uniform antenna array is a one-dimensional antenna array 10a, for example a uniform linear array (ULA) antenna 10a with a plurality of e.g. N many equally spaced antenna elements 12-1, 12-2, 12-3, ..., 12-N, which, in the exemplary depiction of FIG. 2A are arranged a horizontal (array) axis x. The spacing between adjacent antenna elements is indicated by reference sign d. The vertical axis y in FIG. 2A symbolizes a boresight direction BD of the ULA antenna 10a.

Figure 2B:
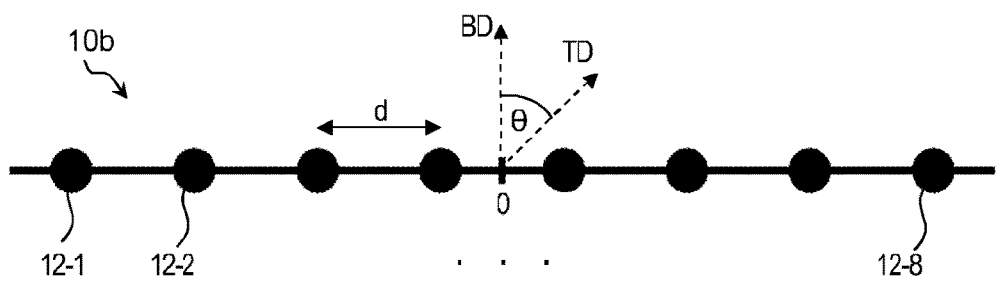

FIG. 2B schematically depicts a further ULA antenna 10b, having N=8 antenna elements 12-1, 12-2, ..., 12-8, equally spaced with generic distance d, which are presently symmetrically centered along the array axis x (FIG. 2A) around a reference coordinate "0". For the exemplary configuration 10b of FIG. 2B, the antenna elements 12-1, 12-2, ..., 12-8 are positioned at the following absolute positions: −3.5d, −2.5d, ..., 3.5d, corresponding to array aperture line (AAL) positions of $$-7\frac{d}{\lambda}, -5\frac{d}{\lambda}, \ldots, 7\frac{d}{\lambda}.$$

Figure 2C:
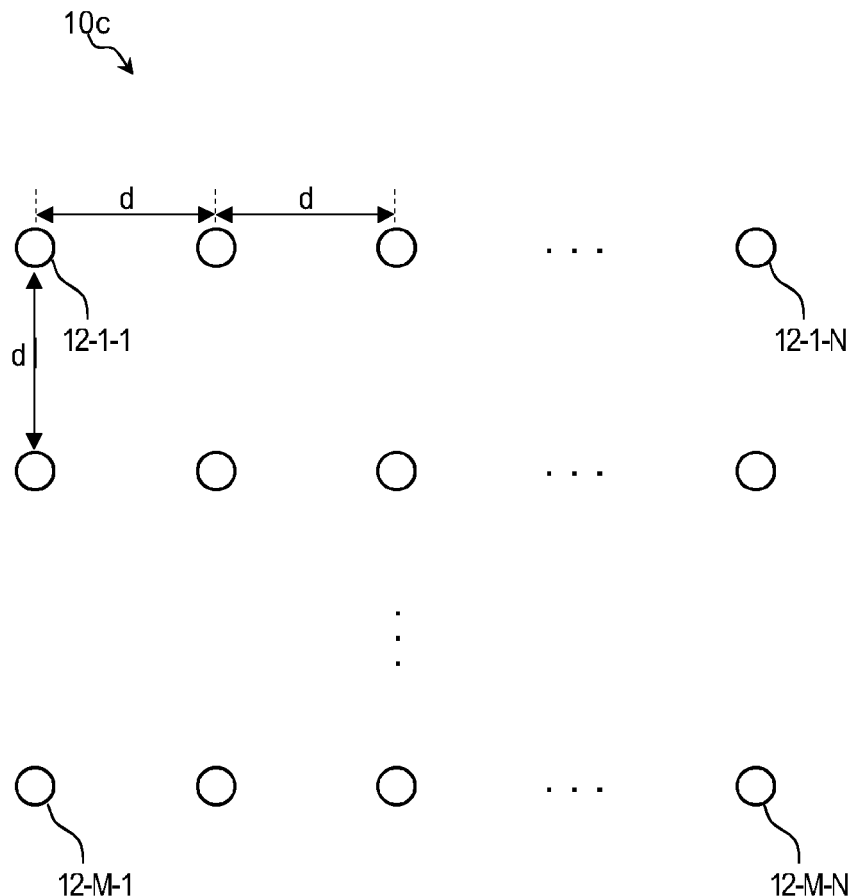

In some embodiments, FIG. 2C, the uniform antenna array is a two-dimensional antenna array, for example a uniform rectangular array (URA) antenna 10c having a matrix-type arrangement with N many rows and M many columns of equally spaced antenna elements 12-1-1, ..., 12-1-N, ..., 12-M-1, ..., 12-M-N.

In some embodiments, the angular response ANG-RESP (FIG. 3) of an antenna array, as e.g. determined by the method according to exemplary embodiments, e.g. the reconstructed angular response, may be used to determine an Angle of Departure (AoD) and/or Angle of Arrival (AoA), for example of a strongest path, for example for communication applications, which, according to some embodiments, may for example enable a base station or generally a transmission and/or reception access point, to serve a user equipment with the best radio beam possible.

In some embodiments, the angular response ANG-RESP of an antenna array, as e.g. determined by the method according to exemplary embodiments, e.g. the reconstructed angular response, may be used in sensing applications, for example to reconstruct an image such as a radar image of an environment, e.g. by evaluating directional information as e.g. characterized by the Angle of Departure and/or by the Angle of Arrival. In some embodiments, beamforming weights to achieve angular scans can e.g. be designed according to some desired Point Spread Function (PSF), that determines an impact e.g. of an impulsive scatterer at a certain angle with respect to the full image. In some embodiments, basically, this impact can be related to the resolution (e.g. characterized by a main lobe width) and the side lobes' relative amplitude.

Some exemplary embodiments, which will be discussed in detail further below, provide information regarding a) how many angles (i.e., corresponding to sample values) and b) which angles should be scanned, e.g. in the course of sampling 200 (FIG. 3), e.g. for the uniform sampling of the angular response in the normalized angular frequency range, e.g. for being able to recover, for example without loss, the angular response ANG-RESP of the antenna array. Further exemplary embodiments, which will also be discussed in detail further below provide information regarding c) how to reconstruct 202 (FIG. 3) the angular response ANG-RESP at some angles, for example at every angle, associated with the considered normalized angular frequency range.

While the further explanations primarily refer to one-dimensional antenna arrays such as e.g. ULA antennas 10a, 10b FIG. 2A, 2B), for sake of simplicity, note that in further exemplary embodiments the principle of the embodiments disclosed herein may also be applied to other antenna array types such as e.g. two-dimensional antenna arrays, for example URA antennas 10c (FIG. 2C).

In some exemplary embodiments, FIG. 2A, 2B the normalized angular frequency range is characterized by $$\phi = \frac{\sin(\theta)}{2},$$

wherein ϕ is a normalized angular frequency, wherein θ characterizes an angle between a boresight direction BD and a target direction TD, e.g. "incoming angle" or incident angle, when exemplarily considering an incoming electromagnetic wave, for example an azimuth angle.

In some exemplary embodiments, FIG. 4, the instructions 106, when executed by the at least one processor 102, cause the apparatus 100 to sample 200a the angular response of the uniform antenna array uniformly in a normalized angular frequency range characterized by an interval $$\left[-\frac{\lambda}{4d}, \frac{\lambda}{4d}\right),$$

wherein λ characterizes a wavelength, wherein d characterizes a distance between adjacent antenna elements.

In some exemplary embodiments, FIG. 4, the instructions 106, when executed by the at least one processor 102, cause the apparatus 100 to use 200b N many sampling points for the sampling 200, 200a of the angular response of the uniform antenna array, wherein N characterizes a number of antenna elements of the uniform antenna array. In other exemplary embodiments, another number of sampling points, i.e. different from N, may be used for the sampling 200, 200a.

In some embodiments, a maximum sampling step size for the sampling 200, 200a of the angular response of the uniform antenna array in the normalized angular frequency range is given by λ/2dN, whereby a loss of information can be avoided.

In some embodiments, for example, if more scans are available, more samples can be taken for the sampling 200, 200a of the angular response, e.g. by sampling with a smaller sampling period, which, in some embodiments may enable to reduce beam misalignment penalties, e.g. with mmWave channel estimation applications.

In some embodiments, if less scans are available, e.g. due to limited resources or a codebook, for example GoB codebook, the resolution can be reduced and the full angular domain can e.g. be scanned by using less antenna elements, thus increasing the sampling period.

In some embodiments, it is possible to focus the available, for example few, scans onto a limited (normalized) angular region of interest, for example by avoiding scans elsewhere, e.g. outside the (normalized) angular region of interest.

In some embodiments, the extremes of the sampled normalized angular frequency range are (or should be)

$$+/- \frac{\lambda}{4d},$$

but in some other embodiments, $$\text{also} +/- 0.5\min\left(1, \frac{\lambda}{2d}\right),$$

can be considered, where d is the distance between adjacent antenna elements and λ is the wavelength. In further exemplary embodiments, other values for the extremes of the sampled normalized angular frequency range are possible.

In some embodiments, FIG. 2A, 2B, the antenna elements 12-1, 12-2, . . . may be spaced more than $$d = \frac{\lambda}{2}$$

apart from each other, wherein aliasing may occur in the angular domain, so that, in further embodiments, a search space may be restricted. In some other exemplary embodiments, the antenna element spacing may also be less than $$d = \frac{\lambda}{2}.$$

In some embodiments, FIG. 5, the instructions 106, when executed by the at least one processor 102, cause the apparatus 100 to reconstruct 202a the angular response ANG-RESP of the uniform antenna array based on a convolution of the set SET-SAMP of angular samples and respective Dirichlet kernels. In some embodiments, this may enable a particularly efficient reconstruction of the angular response ANG-RESP.

In some embodiments, the set SET-SAMP of angular samples is characterized by $$L_N\left(n\frac{\lambda}{2dN}\right),$$

wherein n is an integer, with $$-\frac{N}{2} \leq$$

$$n < \frac{N}{2},$$

wherein N characterizes a number of antenna elements of the uniform antenna array, wherein λ characterizes a wavelength, wherein d characterizes a distance between adjacent antenna elements, wherein the respective Dirichlet kernels DIR-KERN are characterized by $$D_N\left(\frac{2d}{\lambda}\left(l - n\frac{\lambda}{2dN}\right)\right),$$

and wherein the convolution of the set of angular samples and respective Dirichlet kernels is characterized by $$R_N(l) = \sum_{n \in N_N} L_N\left(n\frac{\lambda}{2dN}\right) D_N\left(\frac{2d}{\lambda}\left(l - n\frac{\lambda}{2dN}\right)\right).$$

wherein l characterizes a normalized angular frequency, wherein $R_N(l)$ characterizes a reconstructed angular response, wherein $$N_N = \left\{n \in \mathbb{Z}: -\frac{N}{2} \leq n < \frac{N}{2}\right\}.$$

In some embodiments, if the distance d between adjacent antenna elements corresponds to one half of the wavelength λ, the reconstructed angular response is characterized by $$R_N(l) = \sum_{n \in N_N} L_N\left(\frac{n}{N}\right) D_N\left(l - \frac{n}{N}\right).$$

In some embodiments, the Dirichlet kernel is characterized by $$D_N(\ell) = \frac{\sin \pi N \ell}{N \sin \pi \ell}.$$

Figure 12:
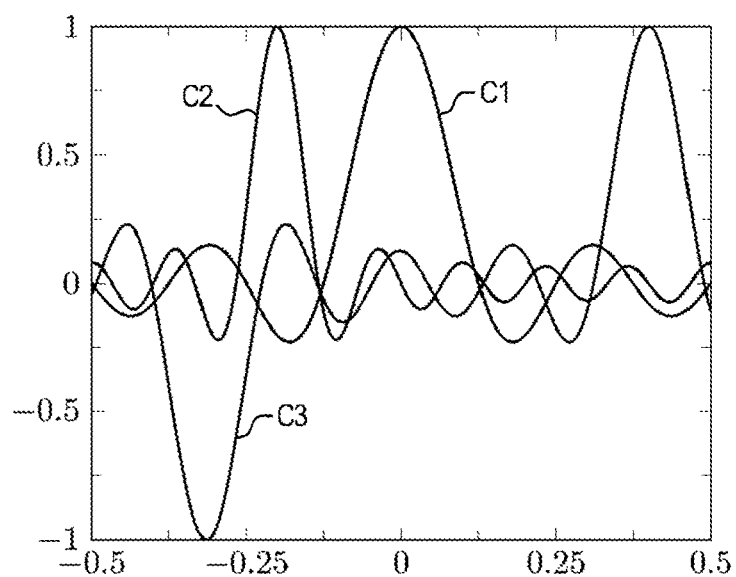

In FIG. 12, Dirichlet kernel examples of the type $$D_N\left(\frac{2d}{\lambda}(l - \eta)\right)$$

according to some embodiments are provided as curves C1, C2, C3, depicted over a normalized angular frequency, the Dirichlet kernel examples corresponding to a normalized angular frequency response of a unitary impulsive (in space) scatterer at a normalized angular frequency η, wherein ULA antennas having different antenna element spacing d and different number N of antenna elements are considered. Curve C1 is associated with the parameters $$\eta = 0, d = \frac{\lambda}{2}, N = 8,$$

curve C2 is associated with the parameters $$\eta = -0.2, d = \frac{\lambda}{2}, N = 15,$$

and curve C3 is associated with the parameters η=0.4, d=0.7λ, N=8.

In some embodiments, a normalized angular frequency response may be characterized by the receive matched beamforming:

$$L_N(\ell) = 1/N \sum_{n=0}^{N-1} a_n e^{-j2\pi \frac{2}{\lambda} x_n \ell},$$

here $a_n$ is the signal of an n-th antenna element, wherein $x_n$ is a location of the n-th antenna element.

In some embodiments, the normalized angular frequency response may be sampled, e.g. at $$\ell = \frac{n\lambda}{2dN},$$

with $$n \in \left\{ n \in \mathbb{Z} : -\frac{N}{2} \leq n < \frac{N}{2} \right\},$$

wherein d is a distance or spacing between adjacent antenna elements, and wherein λ is a wavelength.

For instance, in some embodiments, e.g. in the particular case of the center of the array being at 0, one may consider $$x_n = \left( -\frac{N-1}{2} + n \right) d.$$

In some embodiments, adopting the approach of the exemplary embodiments explained above, a minimum number of samples for a lossless reconstruction for a given array aperture dN (i.e., including a general array spacing with $$d = \frac{\lambda}{2}$$

as a special case) may be determined.

In some embodiments, adopting the approach of the exemplary embodiments explained above enables a reconstruction of the angular response for a reduced angular domain, for example in cases where fewer samples are available.

Moreover, in further exemplary embodiments, the approach of the exemplary embodiments explained above may be extended e.g. to sensing applications.

In some embodiments, a sampled normalized angular frequency response function can be characterized using Dirac's delta function δ(•) where a sample is available and a value of zero elsewhere, for example as defined by the equation:

$$L'_N(\ell) = \sum_{l \in N_N} L_N\left(\frac{l\lambda}{2dN}\right) \delta\left(\ell - \frac{l\lambda}{2dN}\right).$$

In other words, in some embodiments, the set SET-SAMP (FIG. 3) of angular samples as obtained according to exemplary embodiments (see for example block 200 of FIG. 3 and block 200a of FIG. 4) may be characterized by the aforementioned sampled normalized angular frequency response function $L'_N(\ell)$.

In some embodiments, FIG. 5, the instructions 106, when executed by the at least one processor 102, cause the apparatus 100 to determine 205a a period NAF-PERIOD (also denoted as "$P_N$" in the following) of the normalized angular frequency based on a number N of antenna elements of the uniform antenna array, a distance d between adjacent antenna elements of the uniform antenna array, and a wavelength λ, and to reconstruct 205b the angular response of the uniform antenna array based on a circular convolution with the period $P_N$ of the normalized angular frequency of the set $L'_N(\ell)$ of angular samples and respective Dirichlet kernels $$D'_N\left(\frac{2d}{\lambda}\ell\right),$$

wherein $$D'_N\left(\frac{2d}{\lambda}\ell\right) = \begin{cases} D_N\left(\frac{2d}{\lambda}\ell\right) & \text{if } |\ell| \leq P_N/2 \\ 0 & \text{otherwise} \end{cases},$$

wherein in some embodiments $$D'_N\left(\frac{2d}{\lambda}\ell\right)$$

may be interpreted as a windowed Dirichlet kernel, with non-zero elements only in the interval $$\left[ -\frac{P_N}{2}, \frac{P_N}{2} \right].$$

In some embodiments, the period NAF-PERIOD of the normalized angular frequency is characterized by $$P_N = \frac{\lambda}{2d}(1 + \text{mod}_2(N-1)).$$

Note that in these exemplary embodiments the Period $P_N$ doubles with even values of N.

In some embodiments, FIG. 6, the instructions 106 (FIG. 1), when executed by the at least one processor 102, cause the apparatus 100 to determine 210 (FIG. 6) an up-sampled reconstructed angular response ANG-RESP', also denoted as $R_u$ in the following, based on the equation $R_u = F^{-1}(F(l_u) \odot F(d_u))$, wherein $F(\cdot)$ characterizes a discrete Fourier transform, DFT, wherein $F^{-1}(\cdot)$ characterizes an inverse discrete Fourier transform, wherein the vectors $l_u$, $d_u$ are explained in the following, wherein $\odot$ characterizes a Hadamard (i.e., element-wise) product. In some embodiments, this enables a computationally particularly efficient determination of the up-sampled reconstructed angular response ANG-RESP'.

In some embodiments, available samples $L_N(nB_N^{-1})$, $n \in \mathcal{N}_N$ may be up-sampled by the up-sampling factor U, e.g. getting all $L'_N(uB_{NU}^{-1})$, with $u \in \mathcal{N}_{NU}$.

In some embodiments, vectors of elements may be created based on the equation $V = P_N b_{NU} = NU(1 + \text{mod}_2(N-1))$, e.g. spanning a period of continuous functions as defined by the equations $\ell = u\lambda/(2dNU) = u(UB_N)^{-1} = u(B_{NU})^{-1}$, wherein $B_N = 2dN/\lambda$, $B_{NU} = 2dNU/\lambda$. Note that a set of indexes for u according to some embodiments is given further below.

In some embodiments, the vectors are circularly shifted such that their first element corresponds to a zero normalized angular frequency as follows:

$$I_u = \begin{cases} L_N\left(\dfrac{\text{mod}_u(u + V/2) - V/2}{B_{NU}}\right) & \text{if } u = Un, n \in \mathcal{N}_N \\ 0 & \text{otherwise} \end{cases}, \text{ and}$$

$$d_u = D_N\left(\dfrac{u}{NU}\right),$$

where $u \in \{u \in \mathbb{N}_0 : u < V\}$.

Figure 6:
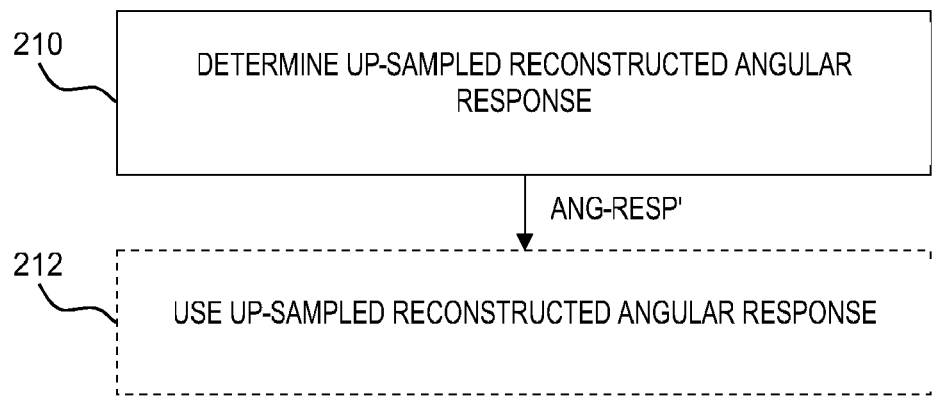

The optional block 212 of FIG. 6 exemplarily depicts a use of the up-sampled reconstructed angular response ANG-RESP' as obtained by block 210, e.g. for purposes of communication and/or sensing.

Figure 7:
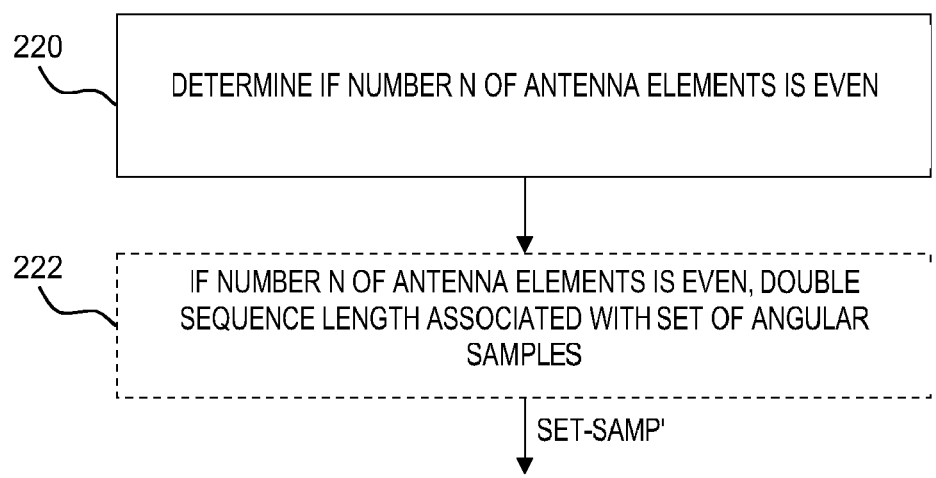

In some embodiments, FIG. 7, the instructions 106, when executed by the at least one processor 102, cause the apparatus 100 to determine 220 if the number N of antenna elements of the uniform antenna array is even, and, if the number N is even, to double 222 a sequence length associated with the set SET-SAMP of angular samples to obtain an extended set SET-SAMP' of angular samples.

In some embodiments, e.g. after extending 222, the extended set SET-SAMP' of angular samples may be used for reconstruction (not shown in FIG. 7), e.g. according to at least one of the approaches explained above, see for example block 202 of FIG. 3.

In the following, impacts of an available number of scans, e.g. being different than N and/or of an antenna element spacing other than $$\frac{\lambda}{2},$$

e.g., $$d \neq \frac{\lambda}{2},$$

according to further exemplary embodiments are discussed.

In some embodiments, e.g. if a number $\bar{N} > N$ of scans are available for the sampling 200, 200a, the angular response may e.g. be sampled with a reduced sampling period (e.g. compared to the above-discussed exemplary embodiments with sampling period or step size of $$\frac{\lambda}{2d\bar{N}})$$

in the normalized angular frequency range. In some embodiments, a reconstruction formula for the reconstruction 202 (FIG. 3) may be adapted accordingly, e.g. characterized by:

$$L'(\ell) = \frac{N}{\bar{N}} \sum_{l \in \mathcal{L}_{\bar{N}}} L_N(l) D_N\left(\frac{2d}{\lambda}(\ell - l)\right).$$

As can be seen, in these exemplary embodiments, too, a Dirichlet Kernel DN of order N is used, however with a normalization factor $\bar{N}/N$.

In some other exemplary embodiments, in case of N'<N many scans (denoted as "aspect 1" in the following), a certain information loss may be present. In some embodiments, this can e.g. happen due to a resource shortage to transmit a signal in a wireless system, or due to an analog beam codebook having a reduced number of beams that can be stored.

In some further exemplary embodiments, there are two options, denoted as "Option 1" and "Option 2", to exploit the information that can be determined based on the available scans, e.g. to make the best out of the scans available.

Option 1: If the full non-aliased angular aperture of $$\frac{\lambda}{2d}$$

is not of interest, in some embodiments, it is proposed to focus the available N' many scans in the directions or angular (sub-) range(s) of interest (e.g., thus not sampling a, for example full, $$\left[-\frac{\lambda}{4d}, \frac{\lambda}{4d}\right]$$

interval), sampling the normalized angular frequency range or domain, respectively, with a period of e.g.

$$\frac{\lambda}{2dN'},$$

and then to interpolate, e.g. reconstruct then angular response ANG-RESP (FIG. 3), in the interval of interest. Note that with $$d < \frac{\lambda}{2},$$

in some embodiments, this allows to limit the normalized angular frequency range or domain, respectively, e.g. within the [−0.5, 0.5] interval, due to the $$\left[-\frac{\pi}{2}, \frac{\pi}{2}\right]$$

limit of the angular domain. In some embodiments, this reduces the number of, for example necessary, scans by approximately a factor of $$\frac{\lambda}{2d}.$$

In some embodiments, minor losses, e.g. in terms of distortion, may result from not probing the full normalized angular frequency domain. However, in some embodiments, this approach according to "Option 1" e.g. allows to preserve a resolution in the direction(s) of interest.

Option 2: If, in some embodiments, the full normalized angular frequency domain aliasing period of interest is $$\left[-\frac{\lambda}{4d}, \frac{\lambda}{4d}\right],$$

in some embodiments it is proposed to reduce a number of operating antenna elements, e.g. to N' contiguous (e.g. mutually adjacent) elements and to perform a reduced scan accordingly with the reduced number N' of antenna elements. In some embodiments, this results in a reconstructed normalized angular frequency response with lower resolution, thus with distortion, due to the reduced aperture of the operating antenna array with the reduced number N' of antenna elements.

In still further exemplary embodiments, the two approaches characterized by "Option 1" and "Option 2" above can be combined, e.g. in case that a number of scans is not sufficient to scan a reduced angular range.

Note that, in some embodiments, e.g. in case of $$d > \frac{\lambda}{2},$$

which is usable e.g. for an antenna element spacing in a vertical direction, a non-aliased interval $$\left[-\frac{\lambda}{4d}, \frac{\lambda}{4d}\right]$$

is smaller than a full (normalized) angular range given by [−0.5, 0.5]. In some embodiments, e.g. to avoid angular aliasing, it is proposed to sample uniformly in the restricted normalized angular frequency interval smaller than $$\left[-\frac{\lambda}{4d}, \frac{\lambda}{4d}\right]$$

and to increase the sampling frequency accordingly to still have N scans to reject aliasing (e.g., instead of sampling the full angular range with the usual sampling period). In some embodiments, e.g. if the available number of scans is lower than N, one can use one of the abovementioned techniques "Option 1", "Option 2" to further reduce the scanned angles and/or resolution.

In some embodiments, FIG. 8, the instructions 106 (FIG. 1), when executed by the at least one processor 102, cause the apparatus 100 to define 230 (FIG. 8) a sum co-array as a virtual antenna array structure VAA-STRUCT associated with a first antenna array and a second antenna array, and to sample 232 an angular response of the sum co-array uniformly in the normalized angular frequency range to obtain a set SET-SAMP-CO of angular samples. In some embodiments, the first antenna array may at least temporarily operate as a transmitter, and the second antenna array may at least temporarily operate as a receiver. The optional block 234 symbolizes a reconstruction of the angular response ANG-RESP-CO of the sum co-array based on the set SET-SAMP-CO of angular samples and at least one Dirichlet kernel.

In some embodiments, for example when performing sensing operations, it may be beneficial to synchronize both a directional transmitter comprising for example a first antenna array, for example a first ULA antenna, and a (directional) receiver comprising for example a second antenna array, for example a second ULA antenna.

In some embodiments, for example with sensing or radar applications in general, there could be antenna arrays with comparatively big apertures both at a transmitter and at a receiver. In some embodiments, in particular, if such antenna arrays are co-located or provided with full duplex capabilities, they may be considered to have the same aperture.

In some embodiments, it is proposed to use the sum co-array technique for dimensioning angular scans and/or for reconstruction, for example with analog structures. As an example, therefore, in some embodiments, in case of a ULA antenna having N many antenna elements as both a transmitter and a receiver (e.g., with a same antenna distance and with a same orientation), the sum co-array may be characterized by a ULA antenna having (2N−1) many antenna elements, wherein, in some embodiments, (2N−1) many angular samples may be determined for sampling the angular response of the sum co-array, and wherein, in some embodiments, a reconstruction may be made using Dirichlet kernels of the same order.

In some embodiments, the principle according to the embodiments may also be applied to other antenna arrays than one-dimensional antenna arrays 10a, 10b as exemplarily depicted by FIG. 2A, 2B, e.g. to two-dimensional antenna arrays 10c as exemplarily depicted by FIG. 2C. In some embodiments, it is proposed to determine two-dimensional angular estimates or samples, e.g. allowing to discriminate both azimuth and elevation.

In some embodiments, a N×M URA antenna 10c (FIG. 2C) can be seen as a sum co-array of a N elements horizontal ULA antenna and a M elements vertical ULA antenna, whose array lines are orthogonal and define a plane of the URA antenna.

In some embodiments, FIG. 9, the instructions 106 (FIG. 1), when executed by the at least one processor 102, cause the apparatus 100 to sample 240 (FIG. 9) an angular response of a uniform two-dimensional antenna array 10c (FIG. 2C) uniformly in respective normalized angular frequency ranges (e.g. being associated with azimuth and elevation, respectively) to obtain a set of angular samples SET-SAMP-2D, and to reconstruct 242 an angular response ANG-RESP-2D of the uniform two-dimensional antenna array 10c based on the set SET-SAMP-2D of angular samples and at least one two-dimensional Dirichlet kernel DIR-KERN-2D.

In some embodiments, it is proposed to determine a, for example full, two-dimensional angular response by performing N·M many scans, i.e. determining N many samples along a first dimension in a respective first normalized angular frequency range and determining M many samples along a second dimension in a respective second normalized angular frequency range, wherein the scanning or sampling directions e.g. correspond with azimuth and elevation angles in a cardinal product of two angular sets of each respective ULA antenna.

In some embodiments, the two-dimensional angular response may be characterized by $$\mathcal{L}_{N,M}^{(Rx)} = \mathcal{L}_N^{(Rx)} \times \mathcal{L}_M^{(Rx)} =$$
$$= \{(nB_N^{-1}, mB_M^{-1}): n \in \mathcal{N}_N, m \in \mathcal{N}_M\}.$$

In some embodiments, the two-dimensional Dirichlet kernels DIR-KERN-2D may be characterized by $$D_{N,M}(\ell, \eta)\left(\frac{2d_1}{\lambda}, \frac{2d_2}{\lambda}\right) = D_N\left(\frac{2d_1}{\lambda}\ell\right) \cdot D_M\left(\frac{2d_2}{\lambda}\eta\right),$$

wherein $d_1$ characterizes a spacing of antenna elements along the first dimension, wherein $d_2$ characterizes a spacing of antenna elements along the second dimension, wherein $\ell$ characterizes a first dimension associated with the normalized angular frequency, and wherein $\eta$ characterizes a second dimension associated with the normalized angular frequency, e.g., in some embodiments, a normalized azimuth frequency and a normalized elevation frequency, as e.g. obtained with the normalized angular frequency transformation explained above.

In some embodiments, e.g., if there is a reduced number of scans (or samples, respectively) available, or if there is no interest for a particularly high resolution in one angular direction, in some embodiments, the scan size can be reduced with techniques like the ones exemplarily described above with respect to "aspect 1".

Figure 10:
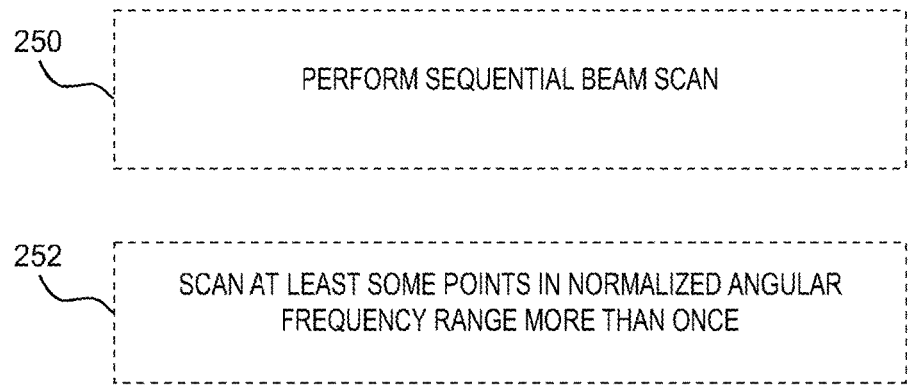

In some embodiments, FIG. 10, the instructions 106 (FIG. 1), when executed by the at least one processor 102, cause the apparatus 100 to perform 250 a sequential beam scan and/or to scan 252 at least some points in the normalized angular frequency range more than once, e.g. for sampling the angular response of a uniform antenna array.

In some embodiments, for example during angular sweeps, a response of an environment may change due to, for example, objects moving. In such settings, a phase may quickly rotate, especially at comparatively high carrier frequencies, which may, in some embodiments, generate distortion or interference, e.g. when reconstructing an angular response.

In view of this, in some embodiments, e.g. for a highly dynamic scenario (for example, with a coherence time in the order of or shorter than a full angular sweep duration), it is proposed to perform 250 (FIG. 10) a sequential beam scan in the normalized angular frequency range, e.g. to keep consecutively scanned angles also close in time, e.g., scanning angles in an ascending/descending order in the normalized angular frequency range.

In some embodiments, some angles can be scanned multiple times, see block 252 of FIG. 10. For example, when sweeping the normalized angular frequency range interval, in some embodiments it is proposed at the end of the sweep to at least partly scan again a beginning of the interval, e.g. to preserve a phase coherence, for example for targets at an end of the normalized angular frequency range interval. For instance, with N=8 and d=λ/2, in some embodiments, it is proposed to scan the normalized angular frequency at the values −0.5, −0.375, −0.25, −0.125, 0, 0.125, 0.25, 0.375, −0.5, −0.375 (e.g., two additional scans at the extremes −0.5, −0.375).

Figure 11:
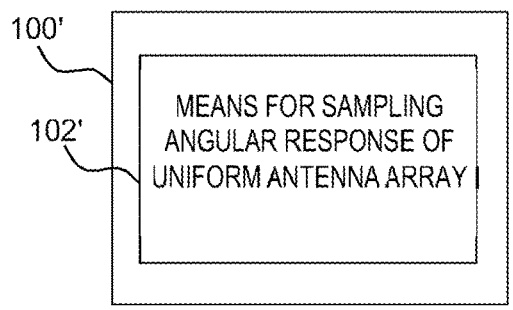

Some embodiments, FIG. 11, relate to an apparatus 100' comprising means 102' for sampling 200 (FIG. 3) an angular response of a uniform antenna array uniformly in a normalized angular frequency range to obtain a set SET-SAMP of angular samples, and reconstructing 202 an angular response ANG-RESP of the uniform antenna array based on the set SET-SAMP of angular samples and at least one Dirichlet kernel DIR-KERN.

In some embodiments, the means 102' (FIG. 11) for sampling 200 and for reconstructing 202 may e.g. comprise at least one processor 102 (FIG. 1), and at least one memory 104 storing corresponding instructions 106.

Some embodiments, FIG. 3, relate to a method comprising: sampling 200, by an apparatus 100, an angular response of a uniform antenna array uniformly in a normalized angular frequency range to obtain a set SET-SAMP of angular samples, and reconstructing 202, by the apparatus 100, an angular response ANG-RESP of the uniform antenna array based on the set SET-SAMP of angular samples and at least one Dirichlet kernel DIR-KERN.

Further embodiments relate to a computer program and/or to a computer program product comprising instructions 106 (FIG. 1) which, when the program is executed by a computer (e.g. comprising the processor 102), cause the computer to carry out the method according to the embodiments.

Some embodiments, FIG. 1, relate to a device 1 for wireless applications such as communications and/or sensing, comprising at least one apparatus 100 (and or at least one apparatus 100', see FIG. 11) according to the embodiments. In some embodiments, the device may be a base state for a cellular communications network. In some embodiments, the device may be a mobile device, e.g. a mobile terminal. Optionally, the device 1 may comprise at least one antenna array (not shown in FIG. 1, see for example FIG. 2A, 2B, 2C), e.g. of the ULA type or of the URA type.

In some embodiments, the principle according to the embodiments enables to efficiently sample and reconstruct a full angular response, e.g. of analog and/or hybrid uniform antenna arrays, e.g. of the ULA type or of the URA type. In some embodiments, the angular response as may be determined by the embodiments may e.g. be used for communication applications, such as for, e.g. cellular, communications networks of e.g. the 5G and/or 6G type or of other types, and/or for sensing applications, e.g. radar sensing and/or radar imaging.

In some embodiments, the principle according to the embodiments can be used in 6G networks, e.g. where analog and hybrid beamforming solutions are deployed (for example at frequency ranges of 7-20 GHz, mmWave, and higher frequencies. In some embodiments, the principle according to the embodiments can be applied in both base stations and sensing (access) points, where 6G networks can e.g. also operate as a radar sensor.

Further, according to yet other exemplary embodiments, an application of the principle according to the embodiments to existing, e.g. already deployed, communications systems is also possible.

In the following, exemplary results associated with the principle according to some exemplary embodiments are presented with reference to FIG. 13, 14, 15.

In some embodiments, a performance of aspects of the principle according to the embodiment is assessed with Monte Carlo simulation experiments. In some embodiments, a single terminal network sensing scenario is considered, with full duplex capabilities. Note that according to further embodiments this is equivalent to a mono-static radar acquisition. The antenna array exemplarily considered consists of a horizontal N elements analog ULA with a corresponding sum co-array of 2N−1 elements ULA. In some embodiments, the central frequency is chosen to be 28 GHz, e.g. in line with mmWave operating frequencies and the fact that analog arrays may be used in 28 GHz base stations. The antenna elements are separated with $$d = \frac{\lambda}{2}$$

and all experience the same AWGN (additive white Gaussian noise) power $\sigma_N^2$.

In some embodiments, impulsive (in space) scatterers are placed in an environment such that their path loss and reflection coefficient is of unitary power. Therefore, in some embodiments, one could assess a performance impact with an equivalent SNR $\sigma_N^{-2}$. The targets are placed randomly at angles in the $[-\theta^*, \theta^*]$ interval.

Note that the exemplary findings presented herein according to some embodiments may, in some other embodiments, be extended, e.g. to more general cases of e.g. radio imaging, apart from the fact that performance, like object resolution, are more difficult to measure.

In some results according to some embodiments, targets move at a constant speed of v m/s, with a uniform random orientation with respect to the antenna array, generating Doppler shifts in acquisitions taken at different times.

In some embodiments, angles are scanned by steering both transmit and receive beamforming weights at the same angle, that is different at each acquisition. Given the 2N−1 elements of the exemplary sum co-array, a minimum of 2N−1 angles are scanned according to exemplary embodiments, it was chosen to select the closest power of two to optimize DFT operations. In some embodiments, by default, the scanned angles are sampled uniformly in the normalized angular frequency range, but in some embodiments, the performance is also benchmarked against uniform sampling in the angular domain, as may e.g. be done in some conventional mmWave base stations. In some embodiments, the angular sweep is executed sequentially from the lowest angular value to the highest, with scan period $P_S$.

In some embodiments, the targets' angular location is estimated by first interpolating the angular scan to 512 points, determining its absolute value's maximum and then further refining the estimate by determining the position of a parabola passing through the maximum and its two neighbour points.

In some embodiments, the investigated algorithms for reconstructing the angular response are:
- a first proposal ("Proposal 1", also denoted as "CONV") according to exemplary embodiments, e.g. based on block 202a of FIG. 5, with 2N many angular samples,
- a second proposal ("Proposal 2", also denoted as "FFT" (or "DFT", according to some embodiments) according to exemplary embodiments, e.g. based on block 210 of FIG. 6, e.g. based on the equation $R_u = F^{-1}(F(l_u) \odot F(d_u))$, with 2N many angular samples,
- a third proposal ("Proposal 3", also denoted as "Red") according to exemplary embodiments, with a reduced number of N many angular samples,
- a conventional cubic spline interpolation (also denoted as "Cubic"), with 2N many samples,
- a conventional baseline approach, where the angular estimate corresponds to the angle with the maximum scan's absolute value among the N performed, which is also denoted as "MaxAbs".

Figure 13:
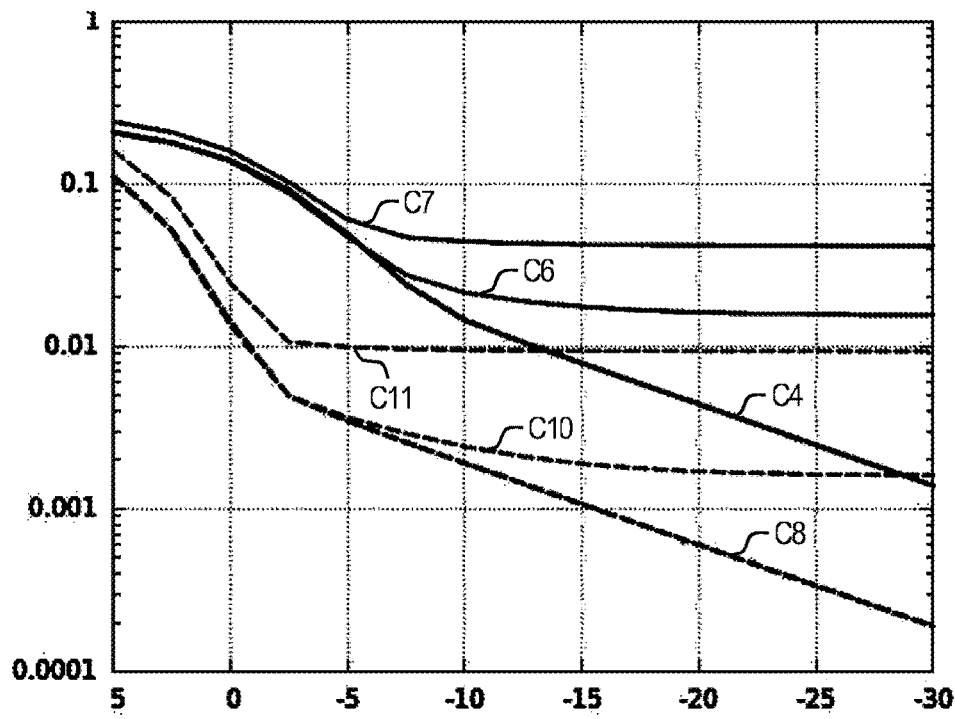

In some embodiments, unless stated otherwise, the default parameters for the performance assessments associated with FIG. 13, 14, 15 are recapped in the following Table 1. The scan period of 8.93 μs is due to the symbol length in 3GPP numerology in presence of 120 kHz sub-carrier spacing, which is a value that can e.g. be used in some mmWave products operating in the 28 GHz frequency bands.

TABLE 1

| default simulation parameters in some embodiments | |
|---|---|
| Base Station Antennas N | 16 |
| Carrier Frequency $f_c$ | 28 GHz |
| Wavelength λ | 10.71 mm |
| Antenna separation d | λ/2 |
| Scan period $P_S$ | 8.93 μs |
| Target speed v | 0 m/s |
| Maximum target's angle θ* | $\frac{\pi}{3}$ rad. (60 deg.) |

FIG. 13 exemplarily depicts a Root Mean Squared error (RMSE) of a normalized angular frequency estimation over a noise power in dB. Curve C4 is associated with "Proposal 1"/"CONV" according to some embodiments, for N=4 antenna elements. Curve C6 is associated with the "Cubic" approach, for N=4 antenna elements. Curve C7 is associated with the "MaxAbs" approach, for N=4 antenna elements.

Curve C8 is associated with "Proposal 1"/"CONV" according to some embodiments, for N=16 antenna elements. Curve C10 is associated with the "Cubic" approach, for N=16 antenna elements. Curve C11 is associated with the "MaxAbs" approach, for N=16 antenna elements.

From FIG. 13 it can be seen that the approaches according to exemplary embodiments, see for example curves C4, C8, may outperform some conventional approaches such as associated with curves C6, C7, C10, C11. In some embodiments, the linear behavior at high SNR values, see for example curves C4, C8, can be interpreted as a signal that, probably, the Cramer Rao Lower Bound of the estimator is achieved, but this is still to be confirmed. As can also be seen from FIG. 13, with higher number N of antenna elements, the performance improves.

In some embodiments, the "Cubic" interpolation (with the right amount of samples) approach, see curve C6 and C10, delivers an error floor at high SNR.

Figure 14:
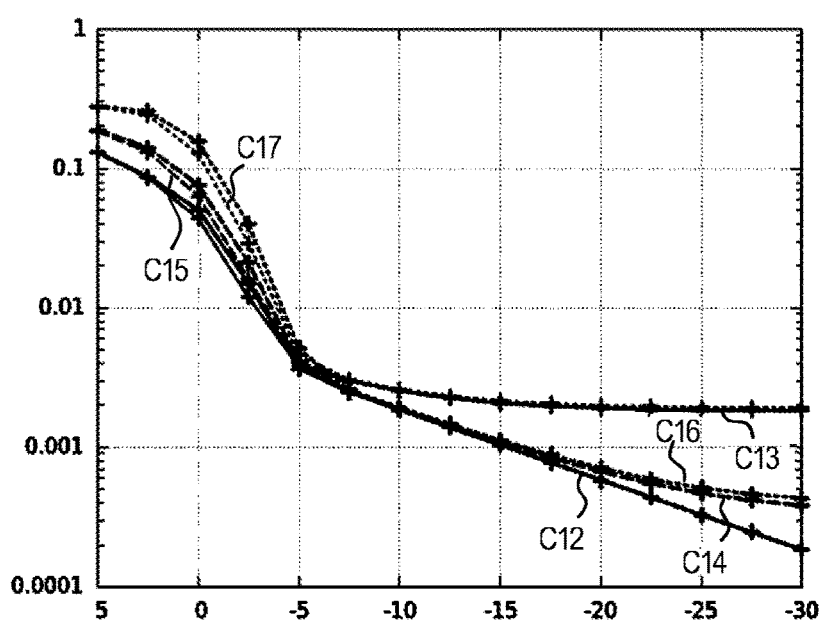

FIG. 14, also depicting RMSE over noise power, shows an impact of speed, e.g. user speed. Curve C12 is associated with "Proposal 1"/"CONV" according to some embodiments, for a speed of 0.0 m/s, curve C13 is associated with the conventional "Cubic" approach, for a speed of 0.0 m/s.

Curve C14 is associated with "Proposal 1"/"CONV" according to some embodiments, for a speed of 12.0 m/s, curve C15 is associated with the conventional "Cubic" approach, for a speed of 12.0 m/s. Curve C16 is associated with "Proposal 1"/"CONV" according to some embodiments, for a speed of 120.0 m/s, curve C17 is associated with the conventional "Cubic" approach, for a speed of 120.0 m/s.

FIG. 14 shows how the proposed mechanism according to exemplary embodiments is more robust, see for example curves C12, C14, until it breaks at extreme target's speeds (120 m/s), see for example curve C16. The exemplary results also show the benefits of sampling uniformly in the normalized angular frequency domain according to some embodiments, with further exemplary embodiments defining the best number of scans to be taken.

Figure 15:
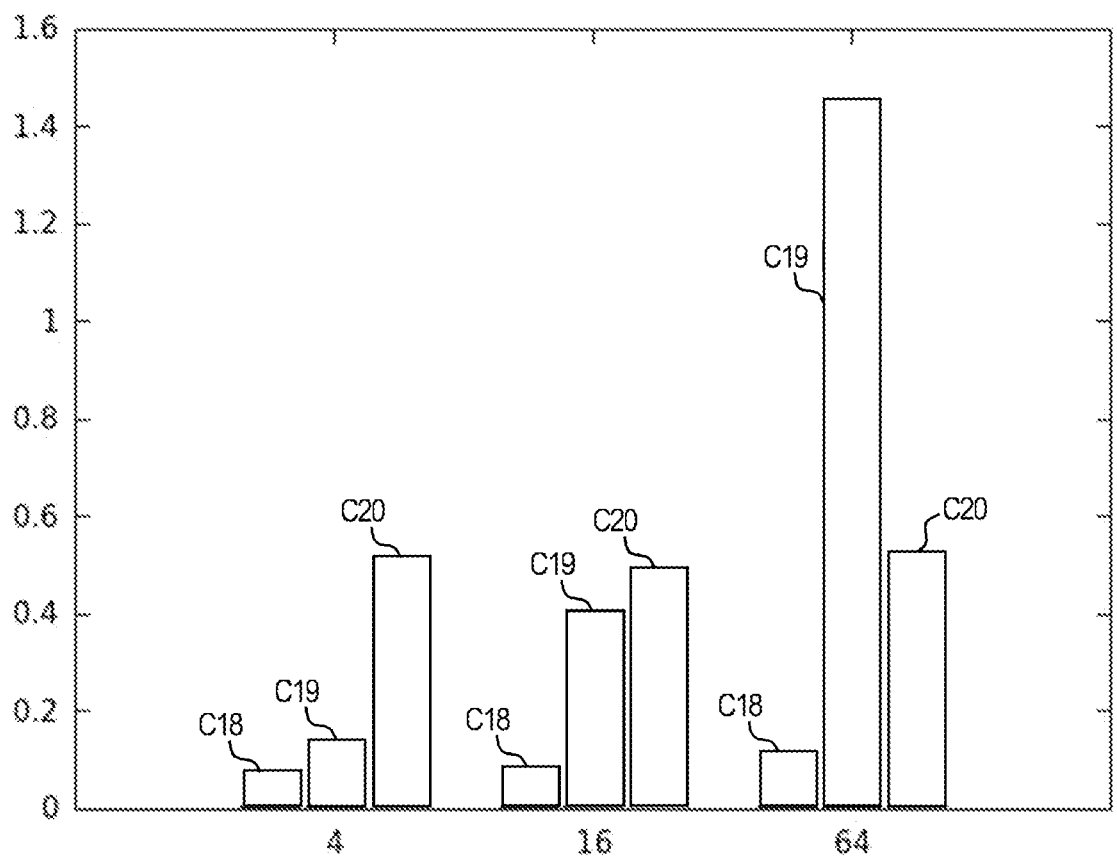

FIG. 15 depicts an average elapsed time in milliseconds (ms) over a number of ULA antenna elements and exemplarily shows the gains in terms of computation time spent with interpolation operations of different approaches. The columns C18 are associated with the abovementioned exemplary "Proposal 2", the columns C19 are associated with the abovementioned exemplary "Proposal 1", and the columns C20 are associated with the conventional "Cubic" interpolation approach. Column C18 indicates a comparatively small processing time associated with the DFT-based approach "Proposal 2" according to some embodiments, while "Proposal 1", see the columns C19, proposes, according to some embodiments, convolutions in the angular domain. As can be seen, the costs of the conventional "Cubic" approach, see columns C20, in terms of computational time, are comparatively high, with respect to the approaches C18, C19 according to exemplary embodiments.

In some embodiments, the complexity reduction attained by "Proposal 2" according to some exemplary embodiments can be appreciated, as well as the minor additional complexity involved with more antenna elements, which is, in some embodiments, in line with the O(N log N) complexity of DFT operations.

The invention claimed is:

1. An apparatus, comprising:
at least one processor; and
at least one memory storing instructions, the at least one memory and the instructions configured to, with the at least one processor, cause the apparatus to sample an angular response of a uniform antenna array uniformly in a normalized angular frequency range to obtain a set (SET-SAMP) of angular samples, to reconstruct an angular response (ANG-RESP) of the uniform antenna array based on the set (SET-SAMP) of angular samples and at least one Dirichlet kernel (DIR-KERN), wherein the normalized angular frequency range is characterized by $$\phi = \frac{\sin(\theta)}{2},$$

wherein $\phi$ is a normalized angular frequency, wherein $\theta$ characterizes an angle between a boresight direction (BD) and a target direction (TD), to determine if the number N of antenna elements of the uniform antenna array is even, and, upon determining that the number N is even, to double a sequence length associated with the set (SET-SAMP) of angular samples to obtain an extended set (SET-SAMP') of angular samples.

2. The apparatus according to claim 1, wherein the instructions, when executed by the at least one processor, cause the apparatus to sample the angular response of the uniform antenna array uniformly in a normalized angular frequency range characterized by an interval $$\left[-\frac{\lambda}{4d}, \frac{\lambda}{4d}\right),$$

wherein $\lambda$ characterizes a wavelength, wherein d characterizes a distance between adjacent antenna elements.

3. The apparatus according to claim 1, wherein the instructions, when executed by the at least one processor, cause the apparatus to use N many sampling points for the sampling of the angular response (ANG-RESP) of the uniform antenna array, wherein N characterizes a number of antenna elements of the uniform antenna array.

4. The apparatus according to claim 1, wherein the instructions, when executed by the at least one processor, cause the apparatus to define a sum co-array as a virtual antenna array structure (VAA-STRUCT) associated with a first antenna array and a second antenna array, and to sample an angular response (ANG-RESP-CO) of the sum co-array uniformly in the normalized angular frequency range to obtain a set (SET-SAMP-CO) of angular samples.

5. The apparatus according to claim 1, wherein the instructions, when executed by the at least one processor, cause the apparatus to sample an angular response of a uniform two-dimensional antenna array uniformly in respective normalized angular frequency ranges to obtain a set (SET-SAMP-2D) of angular samples, and to reconstruct an angular response (ANG-RESP-2D) of the uniform two-dimensional antenna array based on the set (SET-SAMP-2D) of angular samples and at least one two-dimensional Dirichlet kernel (DIR-KERN-2D).

6. The apparatus according to claim 1, wherein the instructions, when executed by the at least one processor, cause the apparatus to perform a sequential beam scan and/or to scan at least some points in the normalized angular frequency range more than once.

7. The apparatus according to claim 1, wherein the instructions, when executed by the at least one processor, cause the apparatus to determine whether less scans than required for a lossless reconstruction of the angular response are available, and, if less scans than required for the lossless reconstruction of the angular response are available, to reduce a resolution.

8. Device for wireless applications, comprising at least one apparatus according to claim 1.

9. The apparatus according to claim 1, wherein the instructions, when executed by the at least one processor, cause the apparatus to reconstruct the angular response (ANG-RESP) of the uniform antenna array based on a convolution of the set (SET-SAMP) of angular samples and respective Dirichlet kernels (DIR-KERN).

10. The apparatus according to claim 9, wherein the set (SET-SAMP) of angular samples is characterized by $$L_N\left(n\frac{\lambda}{2dN}\right),$$

wherein n is an integer, with $$-\frac{N}{2} \leq n < \frac{N}{2},$$

wherein N characterizes a number of antenna elements of the uniform antenna array, wherein λ characterizes a wavelength, wherein d characterizes a distance between adjacent antenna elements, wherein the respective Dirichlet kernels are characterized by $$D_N\left(\frac{2d}{\lambda}\left(l - n\frac{\lambda}{2dN}\right)\right),$$

and wherein the convolution of the set (SET-SAMP) of angular samples and respective Dirichlet kernels (DIR-KERN) is characterized by $$R_N(l) = \sum_{n \in N_N} L_N\left(n\frac{\lambda}{2dN}\right) D_N\left(\frac{2d}{\lambda}\left(l - n\frac{\lambda}{2dN}\right)\right),$$

wherein l characterizes a normalized angular frequency, wherein $L_N(l)$ characterizes a reconstructed angular response (ANG-RESP).

11. The apparatus according to claim 9, wherein the instructions, when executed by the at least one processor, cause the apparatus to determine a period (NAF-PERIOD) of the normalized angular frequency based on a number N of antenna elements of the uniform antenna array, a distance between adjacent antenna elements of the uniform antenna array, and a wavelength, and to reconstruct the angular response (ANG-RESP) of the uniform antenna array based on a circular convolution with the period (NAF-PERIOD) of the normalized angular frequency of the set (SET-SAMP) of angular samples and respective Dirichlet kernels (DIR-KERN).

12. The apparatus according to claim 6, wherein the instructions, when executed by the at least one processor, cause the apparatus to determine an up-sampled reconstructed angular response (ANG-RESP') $R_u$ based on the equation $R_u = F^{-1}(F(l_u) \odot F(d_u))$, wherein F(•) characterizes a discrete Fourier transform, DFT, wherein $F^{-1}$(•) characterizes an inverse discrete Fourier transform, wherein ⊙ characterizes a Hadamard product, wherein $$I_u = \begin{cases} L_N\left(\frac{\mathrm{mod}_u(u + V/2) - V/2}{B_{NU}}\right) & \text{if } u = Un, n \in N_N \\ 0 & \text{otherwise} \end{cases}, \text{ wherein}$$

$$d_u = D_N\left(\frac{u}{NU}\right),$$

where $u \in \{u \in \mathbb{N}_0: u < V\}$, where $V = P_N B_{NU} = NU(1 + \mathrm{mod}_2(N-1))$, where $B_N = 2dN/\lambda$, $b_{NU} = 2dNU/\lambda$.

13. An apparatus comprising means for sampling an angular response of a uniform antenna array uniformly in a normalized angular frequency range to obtain a set (SET-SAMP) of angular samples, reconstructing an angular response (ANG-RESP) of the uniform antenna array based on the set (SET-SAMP) of angular samples and at least one Dirichlet kernel (DIR-KERN), wherein the normalized angular frequency range is characterized by $$\phi = \frac{\sin(\theta)}{2},$$

wherein φ is a normalized angular frequency, wherein θ characterizes an angle between a boresight direction (BD) and a target direction (TD), determining if the number N of antenna elements of the uniform antenna array is even, and, upon determining that the number N is even, doubling a sequence legnth associated with the set (SET-SAMP) of angular samples to obtain an extended set (SET-SAMP') of angular samples.

14. A method comprising: sampling, by an apparatus, an angular response of a uniform antenna array uniformly in a normalized angular frequency range to obtain a set (SET-SAMP) of angular samples, reconstructing, by the apparatus, an angular response (ANG-RESP) of the uniform antenna array based on the set (SET-SAMP) of angular samples and at least one Dirichlet kernel (DIR-KERN), wherein the normalized angular frequency range is characterized by $$\phi = \frac{\sin(\theta)}{2},$$

wherein φ is a normalized angular frequency, wherein θ characterizes an angle between a boresight direction (BD) and a target direction (TD), determining if the number N of antenna elements of the uniform antenna array is even, and, upon determining that the number N is even, doubling a sequence legnth associated with the set (SET-SAMP) of angular samples to obtain an extended set (SET-SAMP') of angular samples.

* * * * *